(12) United States Patent
Fukuzono

(10) Patent No.: US 8,089,146 B2
(45) Date of Patent: Jan. 3, 2012

(54) SEMICONDUCTOR DEVICE AND HEAT RADIATION MEMBER

(75) Inventor: Kenji Fukuzono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/696,611

(22) Filed: Jan. 29, 2010

(65) Prior Publication Data
US 2010/0127364 A1    May 27, 2010

Related U.S. Application Data

(62) Division of application No. 11/500,879, filed on Aug. 9, 2006, now abandoned.

(30) Foreign Application Priority Data

Feb. 28, 2006 (JP) ................... 2006-053227

(51) Int. Cl.
*H01L 23/34* (2006.01)
(52) U.S. Cl. ......... 257/707; 257/710; 257/718; 257/724
(58) Field of Classification Search .................. 257/707
See application file for complete search history.

(56) References Cited

U.S. PATENT DOCUMENTS

| 5,533,256 | A | 7/1996 | Call et al. |
| 5,623,394 | A | 4/1997 | Sherif et al. |
| 6,239,486 | B1 | 5/2001 | Shimizu et al. |
| 6,410,988 | B1 * | 6/2002 | Caletka et al. ............... 257/778 |
| 6,413,353 | B2 | 7/2002 | Pompeo et al. |
| 6,433,412 | B2 | 8/2002 | Ando et al. |
| 6,724,080 | B1 * | 4/2004 | Ooi et al. ....................... 257/704 |
| 6,752,204 | B2 * | 6/2004 | Dishongh et al. ............. 165/185 |
| 6,816,378 | B1 | 11/2004 | Belady et al. |
| 6,818,974 | B2 | 11/2004 | Yokoyama et al. |
| 2001/0050428 | A1 | 12/2001 | Ando et al. |
| 2003/0034569 | A1 | 2/2003 | Caletka et al. |
| 2005/0047094 | A1 | 3/2005 | Hsu et al. |
| 2005/0146021 | A1 | 7/2005 | Edwards |
| 2006/0284289 | A1 | 12/2006 | Fluhrer et al. |

FOREIGN PATENT DOCUMENTS

| JP | 02-131350 A | 5/1990 |
| JP | 9-293808 A | 11/1997 |
| JP | 2000-58686 A | 2/2000 |
| JP | 2000-200870 A | 7/2000 |
| JP | 2001-007255 A | 1/2001 |
| JP | 2001-267473 A | 9/2001 |

(Continued)

OTHER PUBLICATIONS

Japanese Office Action dated Nov. 9, 2010, issued in corresponding Japanese Patent Application No. 2006-053227.

(Continued)

*Primary Examiner* — Wael Fahmy
*Assistant Examiner* — Abul Kalam
(74) *Attorney, Agent, or Firm* — Westerman, Hattori, Daniels & Adrian, LLP

(57) ABSTRACT

A semiconductor device includes a semiconductor element mounted on a substrate; at least one electronic part arranged around the semiconductor element; and a heat radiation member bonded to a backside of the semiconductor element by a bonding material. The heat radiation member has an isolation part extending between an outer circumference of the semiconductor element and the electronic part.

7 Claims, 3 Drawing Sheets

FOREIGN PATENT DOCUMENTS

| | | |
|---|---|---|
| JP | 2001-308215 A | 11/2001 |
| JP | 2004-71977 A | 3/2004 |
| JP | 2004-179227 A | 6/2004 |
| JP | 2005-136272 A | 5/2005 |

OTHER PUBLICATIONS

Japanese Office Action dated Aug. 24, 2010, issued in corresponding Japanese Patent Application No. 2006-053227.

* cited by examiner

SEMICONDUCTOR DEVICE AND HEAT RADIATION MEMBER

CROSS-REFERENCE TO RELATED APPLICATIONS

This application is a divisional of U.S. patent application Ser. No. 11/500,879 filed on Aug. 9, 2006.

BACKGROUND OF THE INVENTION

1. Field of the Invention

The present invention generally relates to semiconductor devices and, more particularly, to a semiconductor having chip part such as a capacitor arranged near a semiconductor element and a heat radiation member such as a heat spreader attached to such a semiconductor device.

2. Description of the Related Art

In recent years, a semiconductor element has become being operated at a higher frequency, and an amount of heat generated during operation has increased. In order to cool the semiconductor element by radiating heat from the semiconductor element, a heat spreader as a heat radiation member is provided to a backside of the semiconductor element mounted on a substrate in many cases. In order to radiate heat efficiently, a heat spreader is formed to have an outer configuration larger than that of the semiconductor element so as to cover the entire semiconductor element. Then, the heat spreader is bonded to the backside of the semiconductor element by a heat transfer bonding material FIG. 1 is a cross-sectional view of a semiconductor device having a conventional heat spreader. As shown in FIG. 1, a semiconductor element 1 is mounted on a printed circuit board 2, and a heat spreader 3 is provided to cover the semiconductor element 1. The heat spreader 3 has a leg part 3a which extends to the printed circuit board 2, and a concavity 3b is formed so as to accommodate the semiconductor element 1 therein.

Chip parts (electronic parts) 4 such as a capacitor are mounted on the printed circuit board 2 in a surrounding area of the semiconductor element 1. Thus, the concavity 3b of the heat spreader 3 is formed in a size which can also accommodate the chip parts 4.

The heat spreader 3 is formed by a metal having excellent heat transfer property such as, for example, copper (Cu), and is bonded to the backside of the semiconductor element 1 by a bonding material 5. As for the bonding material 5, although a heat transfer resin, which is a resin added with heat transfer particles, may be used, a metal bonding material such as a solder or a silver paste has become used so as to further improve the heat transfer property.

A surrounding portion of the concavity 3b of the heat spreader 3, that is, an end surface of the leg part 3a is bonded to the printed circuit board 2. Thereby, the heat spreader 3 is fixed to the printed circuit board 2, and an effect that the printed circuit board 2 is reinforced by the heat spreader 3 is obtained.

If a solder, which is a metal bonding material, is used as the bonding material 5, the heat spreader 3 is placed and temporarily fixed on the printed circuit board 2 in a state where the solder is inserted between the backside of the semiconductor element 1 and a bottom surface of the concavity 3b of the heat spreader 3. The thus-assembled printed circuit board 2 and the heat spreader 3 are put in a reflow furnace and heated to melt the solder, and, thereafter, the melted solder is solidified.

When reflowing the solder as the bonding material 5, if an amount of the solder is excessive, the melted solder may be extruded from the backside of the semiconductor element 1 as shown in FIG. 2. Additionally, when a pressure is applied to the melted solder and an oxide film on the surface of the melted solder is broken, solder particles may scatter from the broken point of the oxide film. In such a case, the extruded solder or scattered solder may contact the chip parts 4 arranged near the semiconductor element 1, which may result in short-circuiting of the chip parts 4.

In order to solve such a problem, there is suggested a technique to cover the chip parts 4 by an under-fill 6, which is filled between the semiconductor element 1 and the printed circuit board 2, by supplying a generous amount of the under-fill 6 (for example, refer to Patent Documents 1 and 2).

Patent Document 1: Japanese Laid-Open Patent Application 2000-200870

Patent Document 2: Japanese Laid-Open Patent Application 2001-267473

As mentioned above, the under-fill 6 filled between the semiconductor element 1 and the printed circuit board 2 is supplied as a liquefied resin having a relatively low viscosity. Thus, even if the under-fill 6 is supplied so as to cover the chip parts 4, there may be a case where the chip parts are not covered completely. Additionally, if many chip parts 4 are arranged, it takes time and effort to supply the under-fill 6 since the under-fill 6 must be supplied to each of the chip parts 4. Moreover, since a large amount of the under-fill 6, which is relatively expensive, must be used, there is a problem that the manufacturing cost of the semiconductor device is increased.

Additionally, if the under-fill 6 is supplied after the chip parts 4 are soldered and when electrodes of opposite ends of each chip part 4 are soldered, there may be many cases where a narrow air gap (indicated by a reference numeral 7 in FIG. 2) is formed between the bottom of the chip part 4 and the printed circuit board 2. If the under-fill 6 is supplied to the chip parts 4 after the chip parts 4 are soldered in the above-mentioned state, there may be a case where the under-fill 6 cannot enter the air gap and the air gap cannot been filled by the under-fill 6.

In such a case, when the semiconductor device is heated in a reflow furnace so as to melt the bonding material 5 to bond the heat spreader 3, the solder on the opposite ends of the chip part 4 is also temporarily heated. At that time, the melted solder may flow into the air gap under the chip part 4 since the upper side of the chip part 4 is covered by the under-fill 6. In such a case, there is a problem in that electrodes on opposite ends of the chip part 4 are short-circuited.

SUMMARY OF THE INVENTION

It is a general object of the present invention to provide an improved and useful semiconductor device in which the above-mentioned problems are eliminated.

A more specific object of the present invention is to provide a semiconductor device in which a melted bonding material is prevented from contacting electronic parts arranged around a semiconductor element when bonding a heat radiation member to the semiconductor element, and a heat radiation member having such a function to prevent the bonding material from being brought into contact with electronic parts near the semiconductor element.

In order to achieve the above-mentioned objects, there is provided according to one aspect of the present invention a semiconductor device comprising: a semiconductor element mounted on a substrate; at least one electronic part arranged around the semiconductor element; and a heat radiation member bonded to a backside of the semiconductor element by a bonding material, wherein the heat radiation member has an isolation part extending between an outer circumference of the semiconductor element and the electronic part.

In the semiconductor device according to the present invention, the isolation part may be formed integrally with the heat radiation member, and may be formed in a frame shape so as to surround an entire circumference of the semiconductor element. The bonding material may be a metal bonding material, which joins the backside of the semiconductor element to the heat radiation member by being melted by heat and thereafter solidified, and may be arranged inside the frame-shaped isolation part. The heat radiation member and the isolation part may be formed by a material having a wetting characteristic to the metal bonding material. The metal bonding material may be one of a solder and a silver paste.

Additionally, in the semiconductor device according to the present invention, the heat radiation member may have a concavity accommodating the semiconductor element and the electronic part, a peripheral part of the concavity being bonded to the substrate, and the isolation part may extend toward the substrate from the heat radiation member, and a predetermined air gap may be formed between an extreme end of the isolation part and the substrate.

Further, in the semiconductor device according to the present invention, the isolation part may be a member different from the heat radiation part and attached to the heat radiation member, and may be formed in a frame shape so as to surround an entire circumference of the semiconductor element. The heat radiation member may have a concavity accommodating the semiconductor element and the electronic part, and the isolation part may be formed by bending a metal plate and fitted into the concavity of the heat radiation member. The bonding material may be a metal bonding material, which joins the backside of the semiconductor element to the heat radiation member by being melted by heat and thereafter solidified, and may be arranged inside the frame-shaped isolation part. The isolation part may be formed by a material having a wetting characteristic to the metal bonding material. The metal bonding material may be one of a solder and a silver paste. A peripheral part of the concavity of the heat radiation member may be bonded to the substrate, and the isolation part extends toward the substrate from the heat radiation member, and a predetermined air gap may be formed between an extreme end of the isolation part and the substrate.

Additionally, there is provided according to another aspect of the present invention a heat radiation member configured and arranged to be bonded by a bonding material to a backside of a semiconductor element around which at least one electronic part is arranged, the heat radiation member including an isolation part formed to extend between an outer circumference of the semiconductor element and the electronic part.

In the heat radiation member according to the present invention may include a concavity accommodating the semiconductor element and the electronic part, wherein the isolation part may be a frame-shaped member having a size larger than an outer configuration of the semiconductor element. An extreme end of the isolation member may be lower than a height of a peripheral part of the concavity from a bottom part of the heat radiation member. The isolation part may be formed by bending a metal plate, and may be fixed to the concavity by being fitted therein.

According to the present invention, when bonding the heat radiation member to the semiconductor element, the melted bonding material does not go beyond the isolation part. Thus, the melted bonding material does not contact the electronic part arranged in the surrounding area of the semiconductor element, which improves reliability of the semiconductor device and also improves yield rate of the semiconductor device.

Other objects, features and advantages of the present invention will become more apparent from the following detailed description when read in conjunction with the accompanying drawings.

DETAILED DESCRIPTION OF THE PREFERRED EMBODIMENTS

Figure 1:
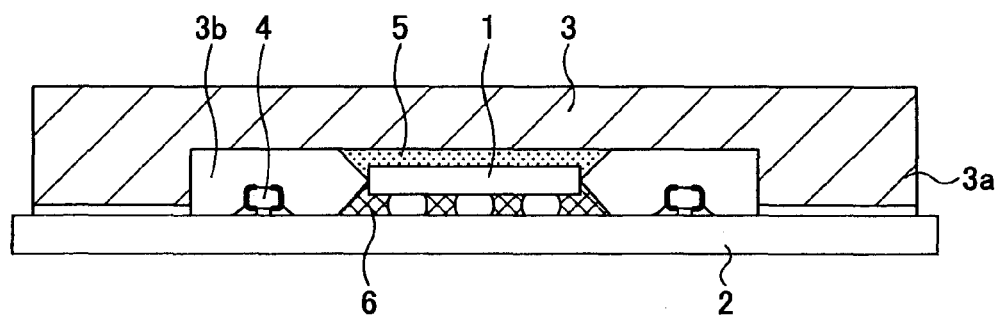
FIG. 1 is a cross-sectional view of a semiconductor device having a conventional heat spreader.
Figure 2:
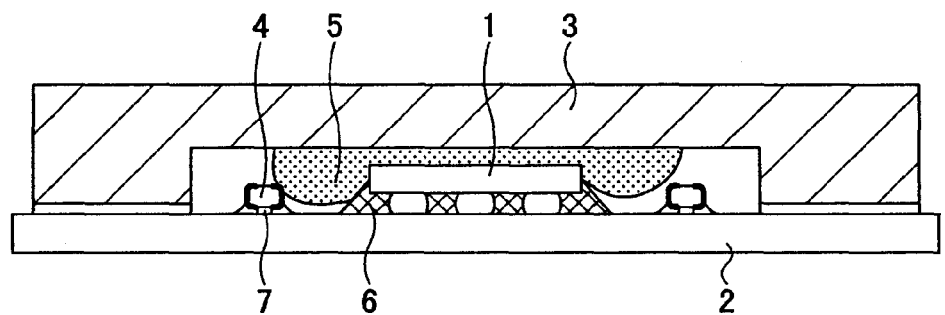
FIG. 2 is a cross-sectional view of the semiconductor device shown in FIG. 1 in a state where a bonding material is extruded.
Figure 3:
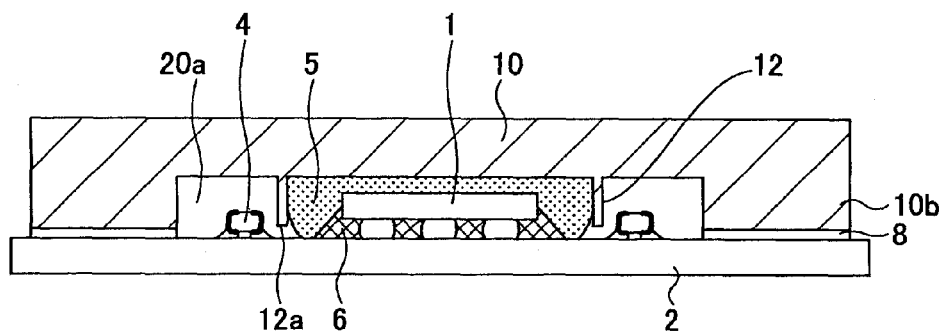
FIG. 3 is a cross-sectional view of a semiconductor device according to a first embodiment of the present invention.

A description will now be given, with reference to FIG. 3, of a semiconductor device according to a first embodiment of the present invention. FIG. 3 is a cross-sectional view of the semiconductor device according to first embodiment of the present invention.

As shown in FIG. 3, a semiconductor element 1 is flip-chip mounted to a printed circuit board 2, and a heat spreader 10 is provided to cover the semiconductor element 1. An under-fill 6 is filled between the semiconductor element 1 and the printed circuit board 2.

The heat spreader 10 as a heat radiation member has a leg part 10*a* extending to the printed circuit board 2 so that a concavity 10*b* is formed to accommodate the semiconductor element 1. That is, the concavity 10*b* is formed by the leg part 10*a* of the peripheral portion of the heat spreader 10.

Chip parts (electronic parts) such as a capacitor or a resistor are mounted on the printed circuit board 2 around the semiconductor element 1. Thus, the concavity 10*b* of the heat spreader 10 is formed in a size which can accommodate the chip parts 4.

The heat spreader 10 is formed of a metal such as copper (Cu) or aluminum (Al) having an excellent heat transfer property, and is bonded to a backside of the semiconductor element 1 by a bonding material 5. As for the bonding material 5, for example, a heat transfer resin, which is prepared by adding heat transfer particles into a resin, may be used. In order to improve the heat transfer property, it is preferable to use a metal bonding material such as a solder, a silver paste or the like. In the present embodiment, the heat spreader 10 is formed of copper (Cu), and a solder, which is bondable to copper and has an excellent heat transfer property, is used for the bonding material 5.

A peripheral part of the concavity 10*b* of the heat spreader, that is, an end surface of the leg part 10*a* is bonded to the printed circuit board 2 by an adhesive 8. Thereby, the heat spreader 10 is fixed to the printed circuit board 2 and also an effect that the printed circuit board 2 is reinforced by the heat spreader 10 is obtained.

Figure 4:
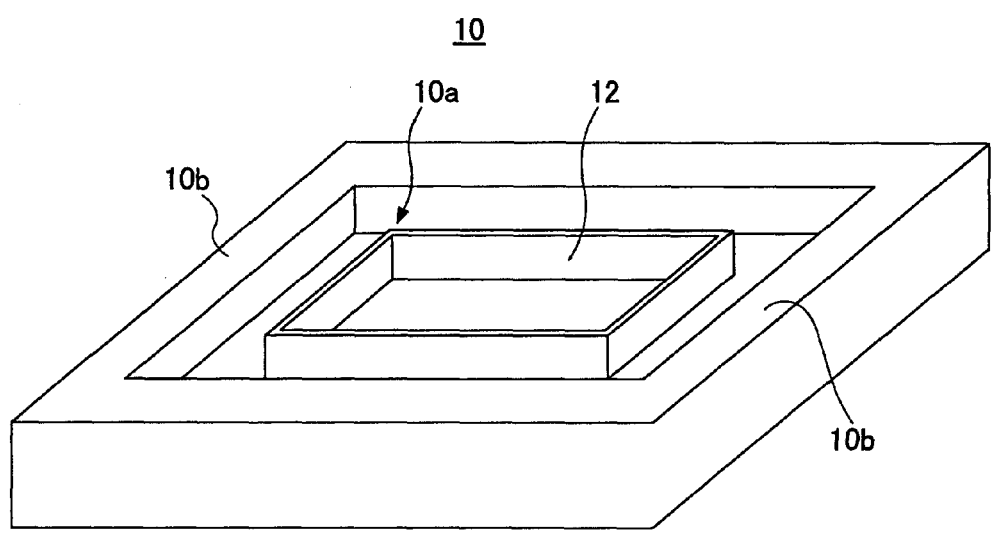
FIG. 4 is a perspective view of a heat spreader shown in FIG. 3.

Here, in the present embodiment, the heat spreader 10 has an isolation part 12 as a portion extending between the semiconductor element 1 and the chip parts 4, when fixed to the semiconductor element 1 and the printed circuit board 2. In the present embodiment, the isolation part 12 is integrally formed with the heat radiation member 10. FIG. 4 is a perspective view of the heat spreader 10. For example, when fabricating the heat spreader 10 by a copper plate, the concavity 10a is formed by machining or etching so as to let the isolation part 12 remaining in a frame-shape.

The frame-shaped isolation part 12 is processed so that an inner size thereof is slightly larger than an outer size of the semiconductor element 1. Additionally, the end part 12a of the isolation part 12 is formed to be slightly lower than the leg part 10b. That is, when the heat spreader 10 is fixed to the printed circuit board 2, as shown in FIG. 3, a height relationship is achieved so that the end part 12a is separated from the printed circuit board and a predetermined small gap is formed therebetween. By providing the gap, the isolation part 12, which is electrically conductive, is prevented from being brought into contact with wirings on the printed circuit board 2 and also the solder as the bonding material 5 is prevented from being extruded outside the isolation part 12.

The heat spreader 10 having the above-mentioned structure has an excellent wetting characteristic to a solder when a solder is used as the bonding material 5 since the portion bonded to the semiconductor element 1 (the bottom of the concavity 10a inside the isolation part 12) and the inner surface of the frame-shaped isolation part 12 are made of copper (Cu).

A description will now be given of a process of bonding the heat spreader 10 to the semiconductor element 1 and fixing the heat spreader 10 to the printed circuit board 2.

The heat spreader 10 is turned over (set in a state shown in FIG. 4) and an appropriate amount of solder paste or solder grains is applied inside the isolation part 12. Then, the adhesive 8 is applied to the end surface of the leg part 10b of the heat spreader 10. Thereafter, the printed circuit board 2 having the semiconductor element 1 and the chip parts 4 mounted thereon is turned over, and is placed on the heat spreader 10 so that the semiconductor element 1 and the chip parts 4 are accommodated in the isolation part 12. Then, the printed circuit board 2 and the heat spreader 10 are tentatively fixed to each other by clamping by a clip or the like, and are put into a reflow furnace in that state to be heated. According to the heating by the reflow furnace, the solder between the backside of the semiconductor element 1 and the bottom surface of the concavity 10a of the heat spreader 10 inside the isolation part 12 is melted.

Although the excessive solder is protruded from the backside of the semiconductor element 1 when the solder is melted, the protrusion of the solder is stopped by the inner surface of the isolation part 12, and the solder cannot protrude beyond the isolation part 12, which results in the melted solder being retained within the isolation part 12. Since the inner surface of the isolation part 12 has an excellent wetting property to the solder, the melted solder adheres to the inner surface of the isolation part 12 and is effectively retained inside the isolation part 12. Moreover, even if an oxide film on the surface of the melted solder is broken and the solder is scattered when the melted solder is being extruded, the scattered solder merely adheres to the inner surface of the isolation part 12, and the solder does not go out of the isolation part 12.

As mentioned above, the melted solder is retained inside the isolation part 12, and the melted solder does not reach the chip parts 4. Thus, a problem that the chip parts are short-circuited due to the solder as the bonding material 5 can be eliminated.

It should be noted that the adhesive 8 is cured by heating in the reflow furnace, and the heat spreader 10 is bonded to the printed circuit board 2. After the heating is ended, the semiconductor device is taken out of the reflow furnace and cooled. Thus, the solder is solidified and turned to the bonding material 5 shown in FIG. 3, and the heat spreader 10 as a heat radiation member is bonded to the backside of the semiconductor element 1 by the bonding material 5.

As mentioned above, the semiconductor device according to the present embodiment has the heat spreader 10 as a heat radiation member so that the isolation part 12 of the heat spreader 10 suppresses protrusion of the solder. The isolation part 12 can be formed simultaneously when forming processing the heat spreader 10. Therefore, the protrusion of the solder can be prevented merely by changing the machining form of the heat spreader without increasing a number of parts, which does not increase a manufacturing cost of the semiconductor device. Additionally, the reliability of the semiconductor device having the heat spreader is improved, and a defective rate due to protrusion of a solder can be reduced, which improves a yield rate of the semiconductor device.

Figure 5:
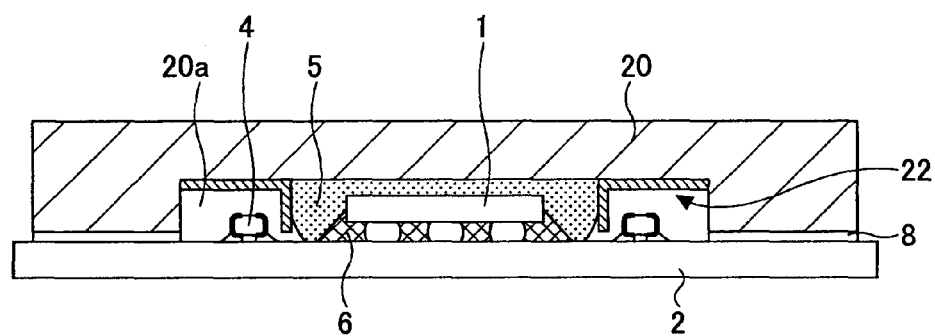
FIG. 5 is a cross-sectional view of a semiconductor device according to a second embodiment of the present invention.
Figure 6:
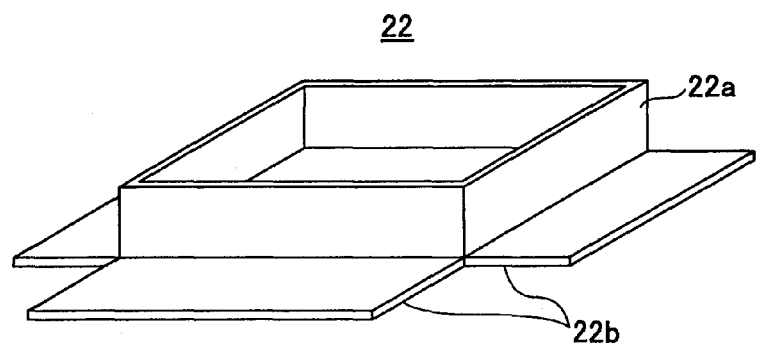
FIG. 6 is a perspective view of an isolation member shown in FIG. 5.

A description will now be given, with reference to FIGS. 5 and 6, of a semiconductor device according to a second embodiment of the present invention. FIG. 5 is a cross-sectional view of the semiconductor device according to the second embodiment of the present invention. FIG. 6 is a perspective view of an isolation member shown in FIG. 5. In FIG. 5, parts that are the same as the parts shown in FIG. 3 are given the same reference numerals, and descriptions thereof will be omitted.

The semiconductor device according to the present embodiment has basically the same structure as the semiconductor device according to the above-mentioned first embodiment except for the structure of a heat spreader 20 being different from the heat spreader 10. The heat spreader 20 according to the present embodiment is provided with an isolation member 22 as a separate member as a member constituting the isolation part 12 of the heat spreader 10.

The isolation member 22 has a shape in which an attaching parts 22b are protruded around a frame-shaped part 22a formed of, for example, a copper plate, as shown in FIG. 5. A dimension of protrusion of the attaching parts 22b is determined in accordance with a size of inside of a concavity 20a of the heat spreader 20 so that the isolation member 22 is fit into the concavity 20a by using an elasticity of the copper plate.

Although the isolation member 22 is formed to provide the same effect as the above-mentioned isolation part 12 in the present embodiment, it is not limited to a copper plate. The isolation member 22 may be formed of a metal plate other than a copper plate, or formed of an insulating material so as to prevent short-circuiting when the isolation member 22 is brought into contact with the chip parts 4 or wirings on the printed circuit board 2. When the isolation member 22 is formed by an insulating material, gold plating or nickel plating may be applied to a portion requiring a wetting characteristic to a solder. Additionally, the frame-shaped part 22a and the attaching parts 22b of the isolation member 22 may be formed as separate parts and are bonded to each other. That is, any structure may be used if the frame-shaped part 22a can be attached to a predetermined position of the heat spreader 20.

The heat spreader provided with the above-mentioned isolation member 22 also provides the same effect as the heat spreader 10 according to the above-mentioned first embodiment. The heat spreader 20 according to the present embodiment can be a shape the same as a conventional heat spreader having a concavity like the concavity 20a, and, therefore, protrusion of a solder can be prevented by merely attaching the isolation member 22 after forming the heat spreader.

The present invention is not limited to the specifically disclosed embodiments, and variations and modifications may be made without departing form the scope of the present invention.

The present application is based on Japanese priority application No. 2006-053227 filed Feb. 28, 2006, the entire contents of which are hereby incorporated herein by reference.

What is claimed is:

1. A semiconductor device comprising:
    a semiconductor element mounted on a substrate by being joined to the substrate by an under-fill material;
    at least one electronic part arranged around the semiconductor element; and
    a heat radiation member bonded to a backside of said semiconductor element by a bonding material,
    wherein the heat radiation member has an isolation part extending between an outer circumference of said semiconductor element and said electronic part,
    wherein said isolation part is a member different from said heat radiation member and attached to said heat radiation member, and is formed in a frame shape so as to surround an entire circumference of said semiconductor element, an extreme end of said isolation part extending to a position adjacent to said substrate,
    wherein said bonding material covers side surfaces of said semiconductor element and reaches and contacts with said under-fill material,
    wherein said isolation part surrounds and contacts with said bonding material covering the side surfaces of said semiconductor element.

2. The semiconductor device as claimed in claim 1, wherein said heat radiation member has a concavity accommodating said semiconductor element and said electronic part, and said isolation part is formed by bending a metal plate and fitted into the concavity of said heat radiation member.

3. The semiconductor device as claimed in claim 1, wherein said bonding material is a metal bonding material, which joins said backside of said semiconductor element to said heat radiation member by being melted by heat and thereafter solidified, and is arranged inside said frame-shaped isolation part.

4. The semiconductor device as claimed in claim 3, wherein said isolation part is formed by a material having a wetting characteristic to said metal bonding material.

5. The semiconductor device as claimed in claim 3, wherein said metal bonding material is one of a solder and a silver paste.

6. The semiconductor device as claimed in claim 2, wherein a peripheral part of said concavity of said heat radiation member is bonded to said substrate, and said isolation part extends toward said substrate from said heat radiation member, and a predetermined air gap is formed between an extreme end of said isolation part and said substrate.

7. The semiconductor device as claimed in claim 1, wherein a distance between said substrate and an extreme end of said isolation part is smaller than a distance between said semiconductor element and said substrate.

* * * * *